United States Patent
Swoboda

(10) Patent No.: US 9,310,434 B2
(45) Date of Patent: Apr. 12, 2016

(54) SCAN TOPOLOGY DISCOVERY IN TARGET SYSTEMS

(71) Applicant: Texas Instruments Incorporated, Dallas, TX (US)

(72) Inventor: Gary L. Swoboda, Sugar Land, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/918,854

(22) Filed: Oct. 21, 2015

(65) Prior Publication Data

US 2016/0041224 A1 Feb. 11, 2016

Related U.S. Application Data

(62) Division of application No. 14/637,078, filed on Mar. 3, 2015, now Pat. No. 9,194,910, which is a division of application No. 14/340,908, filed on Jul. 25, 2014, now Pat. No. 9,009,554, which is a division of (Continued)

(51) Int. Cl.
*G01R 31/28* (2006.01)
*G01R 31/3177* (2006.01)
*G01R 31/3185* (2006.01)

(52) U.S. Cl.
CPC .... *G01R 31/3177* (2013.01); *G01R 31/318533* (2013.01); *G01R 31/318538* (2013.01); *G01R 31/318544* (2013.01)

(58) Field of Classification Search
CPC ............... G01R 31/318538; G01R 31/318544; G01R 31/318533; G01R 31/3177

USPC .......................................... 714/726, 727, 729
See application file for complete search history.

(56) References Cited

U.S. PATENT DOCUMENTS

| | | | | |
|---|---|---|---|---|
| 5,682,392 A | * | 10/1997 | Raymond et al. | 714/727 |
| 5,850,397 A | * | 12/1998 | Raab et al. | 370/392 |
| 6,311,302 B1 | * | 10/2001 | Cassetti et al. | 714/727 |
| 6,658,614 B1 | * | 12/2003 | Nagoya | 714/727 |
| 6,754,863 B1 | * | 6/2004 | Grannis, III | 714/729 |
| 6,886,110 B2 | * | 4/2005 | O'Brien | 714/34 |
| 6,925,410 B2 | * | 8/2005 | Narayanan | 702/150 |
| 7,673,023 B1 | * | 3/2010 | Nelson et al. | 709/221 |
| 7,793,182 B2 | * | 9/2010 | Whetsel | 714/729 |
| 7,870,455 B2 | * | 1/2011 | Mayer | 714/734 |
| 7,877,653 B2 | * | 1/2011 | Whetsel | 714/727 |

(Continued)

OTHER PUBLICATIONS

Lau, Stephen, "Squeezing the power out of a Debug and Test Interface (DTI) IEEE P1149.7, a complementary superset of the IEEE 1149.1 standard", Dec. 3, 2007, TI Public Data, pp. 1-26.*

(Continued)

*Primary Examiner* — John J Tabone, Jr.
(74) *Attorney, Agent, or Firm* — Lawrence J. Bassuk; Frank D. Cimino

(57) ABSTRACT

Topology discovery of a target system having a plurality of components coupled with a scan topology may be performed by driving a low logic value on the data input signal and a data output signal of the scan topology. An input data value and an output data value for each of the plurality of components is sampled and recorded. A low logic value is then scanned through the scan path and recorded at each component. The scan topology may be determined based on the recorded data values and the recorded scan values.

2 Claims, 7 Drawing Sheets

Related U.S. Application Data application No. 14/101,871, filed on Dec. 10, 2013, now Pat. No. 8,826,088, which is a division of application No. 13/948,373, filed on Jul. 23, 2013, now Pat. No. 8,631,289, which is a division of application No. 13/560,470, filed on Jul. 27, 2012, now Pat. No. 8,522,093, which is a division of application No. 12/511,957, filed on Jul. 29, 2009, now Pat. No. 8,255,749.

(60) Provisional application No. 61/084,474, filed on Jul. 29, 2008, provisional application No. 61/084,471, filed on Jul. 29, 2008, provisional application No. 61/084,463, filed on Jul. 29, 2008, provisional application No. 61/084,458, filed on Jul. 29, 2008, provisional application No. 61/084,453, filed on Jul. 29, 2008, provisional application No. 61/084,439, filed on Jul. 29, 2008.

(56) References Cited

U.S. PATENT DOCUMENTS

| | | | |
|---|---|---|---|
| 2003/0225566 A1* | 12/2003 | O'Brein et al. | 703/24 |
| 2009/0013226 A1* | 1/2009 | Swoboda et al. | 714/726 |
| 2011/0041010 A1* | 2/2011 | Mayer | 714/30 |
| 2011/0202811 A1* | 8/2011 | Whetsel | 714/733 |

OTHER PUBLICATIONS

IPextreme, Inc., cJTAG IEEE 1149.7 cJTAG Logic Product Brochure, 2008, IPextreme, Inc., pp. 1-2.*

* cited by examiner

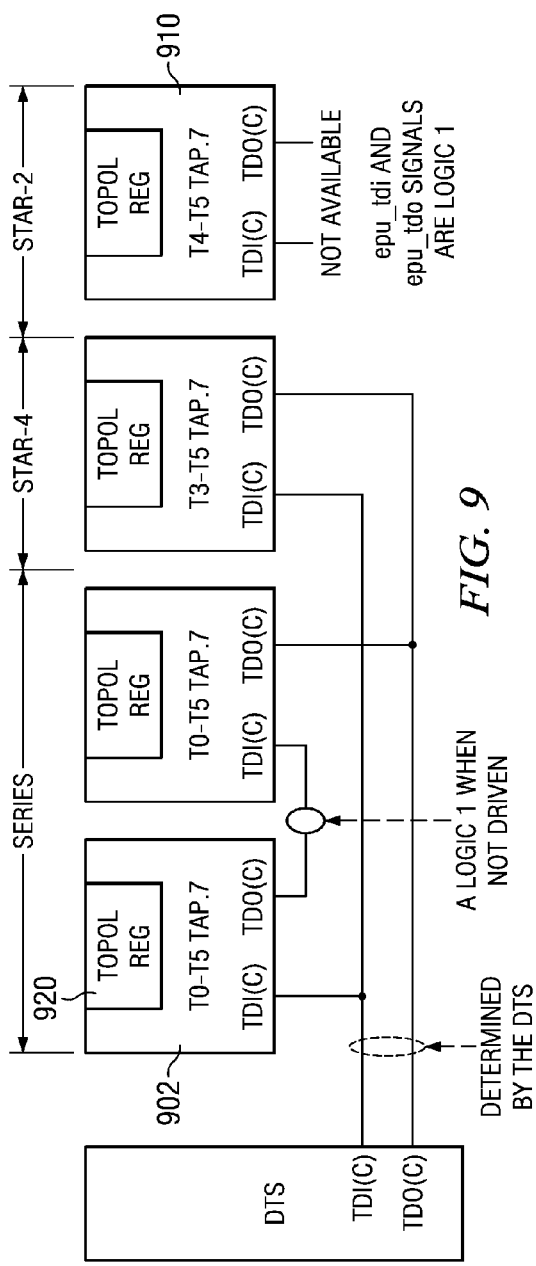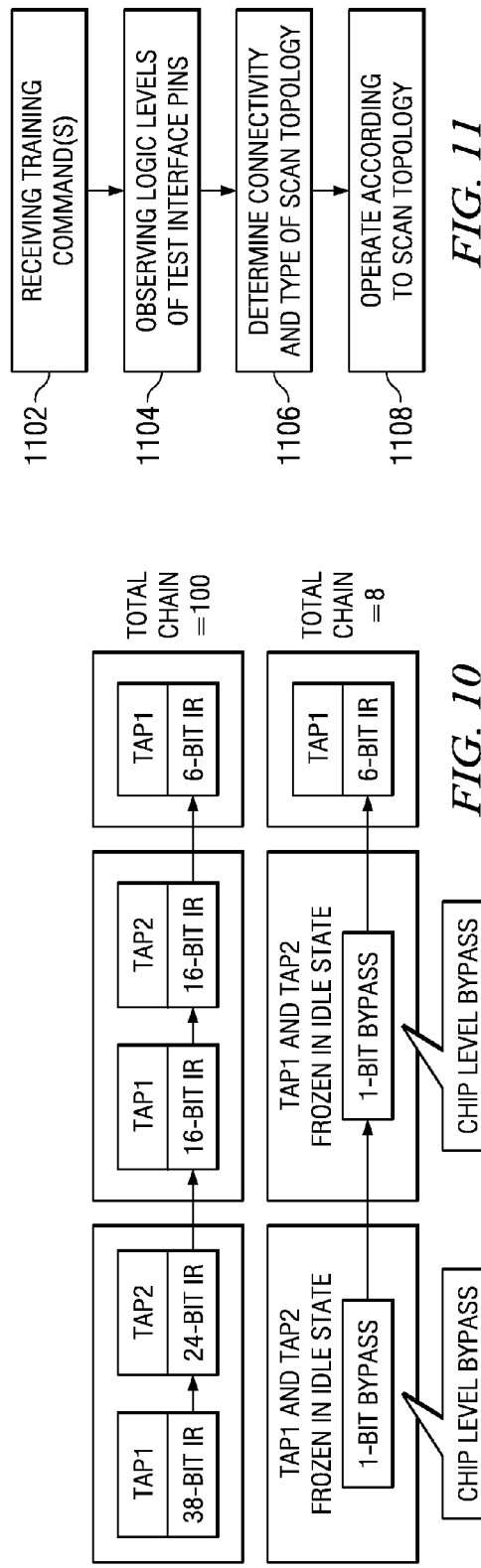

SCAN TOPOLOGY DISCOVERY IN TARGET SYSTEMS

CLAIM OF PRIORITY

This Application is a divisional of prior application Ser. No. 14/637,078, filed Mar. 3, 2015, now U.S. Pat. No. 9,194,910, granted Nov. 24, 2015;

Which was a divisional of prior application Ser. No. 14/340,908, filed Jul. 25, 2014, now U.S. Pat. No. 9,009,554, granted Apr. 14, 2015;

Which is a divisional of prior application Ser. No. 14/101,871, filed Dec. 10, 2013, now U.S. Pat. No. 8,826,088, granted Sep. 2, 2014;

Which is a divisional of prior application Ser. No. 13/948,373, filed Jul. 23, 2013, now U.S. Pat. No. 8,631,289, granted Jan. 14, 2014;

Which is a divisional of prior application Ser. No. 13/560,470, filed Jul. 27, 2012, now U.S. Pat. No. 8,522,093, granted Aug. 27, 2013;

Which is a divisional of prior application Ser. No. 12/511,957, filed Jul. 29, 2009, now U.S. Pat. No. 8,255,749, granted Aug. 28, 2012.

The present application claims priority to and incorporates by reference U.S. Provisional Application No. 61/084,474 filed Jul. 29, 2008, entitled "Topology Discovery Training"

The present application also claims priority to and incorporates by reference U.S. Provisional Application No. 61/084,471 filed Jul. 29, 2008, entitled "Series Equivalent Scans Across Multiple Scan Topologies."

The present application also claims priority to and incorporates by reference U.S. Provisional Application No. 61/084,463 filed Jul. 29, 2008, entitled "Selecting a Scan Topology."

The present application also claims priority to and incorporates by reference U.S. Provisional Application No. 61/084,458 filed Jul. 29, 2008, entitled "Automatic Scan Format Selection Based on Scan Topology Selection."

The present application also claims priority to and incorporates by reference U.S. Provisional Application No. 61/084,453 filed Jul. 29, 2008, entitled "Dynamic Broadcast of Configuration Loads Supporting Multiple Transfer Formats."

The present application also claims priority to and incorporates by reference U.S. Provisional Application No. 61/084,439 filed Jul. 29, 2008, entitled "Timing Protected Detection of Alternate Signaling Mechanism Using Clock and Data."

FIELD OF THE INVENTION

This invention generally relates to the field of testing integrated circuits and systems containing integrated circuits.

BACKGROUND OF THE INVENTION

The IEEE 1149.1 standard was adopted in 1990. Built upon the work of the Joint Test Action Group (JTAG), it provided a pins-out view from one IC pad to another to help test engineers locate and discover faulty PC boards. A description of the boundary scan description language was added in 1994.

Complications arose as chips increased functionality and designs shifted away from PC boards to multichip modules and stacked die packages. These difficulties included handling the pin count requirements and multiple Test Access Port (TAP) controllers for System-on-Chip (SoC) devices, testing multichip modules and stacked die configurations, enhancing debug performance, and improving test and debug logic power-down in low-power conditions.

Organizations like the Mobile Industry Processor Interface Alliance and the NEXUS 5001 Forum took up the challenge to solve the problems specific to their industries.

BRIEF DESCRIPTION OF THE DRAWINGS

Particular embodiments in accordance with the invention will now be described, by way of example only, and with reference to the accompanying drawings:

FIG. 9 is a block diagram illustrating system connectivity supported by the TAP.7 architecture;

FIG. 10 is a block diagram illustrating bypass bits; and

FIG. 11 is a flow diagram illustrating topology discovery in a target system.

DETAILED DESCRIPTION OF EMBODIMENTS OF THE INVENTION

As chips add new functionality and system designs evolve away from boards and toward multi-chip system-on-chip (SoC) architectures, developers of handheld and consumer electronics are faced with stricter pin and package constraints. The IEEE 1149.7 standard is a new two-pin test and debug interface standard that supports half the number of pins of the IEEE 1149.1 technology, allowing developers to easily test and debug products with complex digital circuitry, multiple CPUs and applications software in products such as mobile and handheld communication devices.

Systems and integrated circuits that utilize IEEE 1149.7 may be designed to include a complex scan topology. Circuits and methods for determining the scan topology during a test session will be described in more detail below.

The IEEE 1149.7 is a complementary superset of the widely adopted IEEE 1149.1 (JTAG) standard that has been in use for more than two decades. This standard defines a port into embedded systems for device manufacturing, testing and software development during system development. In addition to maintaining compatibility with IEEE 1149.1, the new standard improves debug capabilities and reduces SoC pin-count requirements. It also standardizes power-saving conditions, simplifies manufacturing of multi-chip modules and stacked die devices, and provides the ability to transport instrumentation data. Concepts and terminology used in IEEE 1149.1 and in IEEE 1149.7 are used in a similar manner herein and are therefore not described in detail herein.

Rather than replacing IEEE 1149.1, the new IEEE 1149.7 standard expands its functionality while reducing the number of pins used in some configurations. It supports new scan topologies that are favorable to stacked die and multichip module configurations and offers advanced capabilities to aid in software debug. It describes circuitry that may be added to an integrated circuit to provide access to on-chip IEEE standard test access ports (TAPs) specified by IEEE Std 1149.1-2001. It provides complete backward compatibility with the 1149.1 standard while aggressively adding features to supporting applications test and debug. The circuitry uses IEEE Standard 1149.1-2001 as its foundation.

The 1149.7 Standard delivers these capabilities with six classes of test access ports (T0-T5), with each class providing incremental capability. The IEEE 1149.7 standard has two groups of capabilities: Classes T0 through T3, which extend IEEE 1149.1 and enable new operations using the IEEE 1149.1 protocol, and Classes T4 and T5, which are focused on advanced two-pin operation using an Advanced Protocol.

Figure 1:
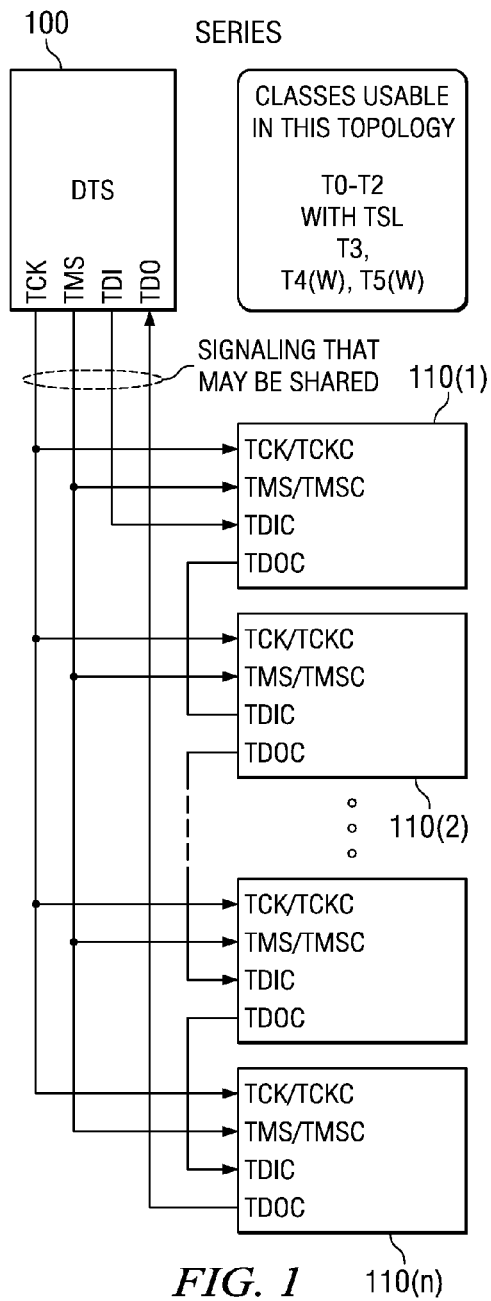
FIG. 1 is a block diagram illustrating a target system with series scan topology.

Class T0 ensures compliance with the industry's test infrastructure by setting up IEEE 1149.7 devices to make them act compatibly with IEEE 1149.1. These techniques include the use of N-bit IR, 1-bit DR for bypass instruction, mandatory IDCODE (32-bit path), and mandatory instructions behaving as specified in the IEEE 1149.1 specification. After a test logic reset is initiated, all multi-TAP devices must conform to the mandatory IEEE 1149.1 instruction behavior and implement a 1-bit DR scan for the bypass instruction. FIG. 1 illustrates such a system. Debug test system (DTS) 100 is generally a computer based system that provides control and a user interface for testing an integrated chip, printed circuit board or SoC using IEEE 1149.1 that has been enhanced to support the IEEE 1149.7 protocols. DTS 100 may be an XDS emulator from Texas Instruments, for example. Modules 110(1)-110(n) are representative of various modules that may be interconnected to DTS 100 using various aspects that will be described in more detail below.

Class T1 instantiates a control system for the IEEE 1149.7 standard that is transparent to IEEE 1149.1 devices, providing a foundation for the advanced functionality implemented in Classes T1 through T5 without changing the IEEE 1149.1 state machine. It supports standardized test and functional resets along with power management of the TAP controller and test logic.

Class T2 offers a chip-level bypass mechanism that shortens scan paths and another mechanism that provides hot connect capability to achieve higher performance for testing high chip count applications.

Figure 2:
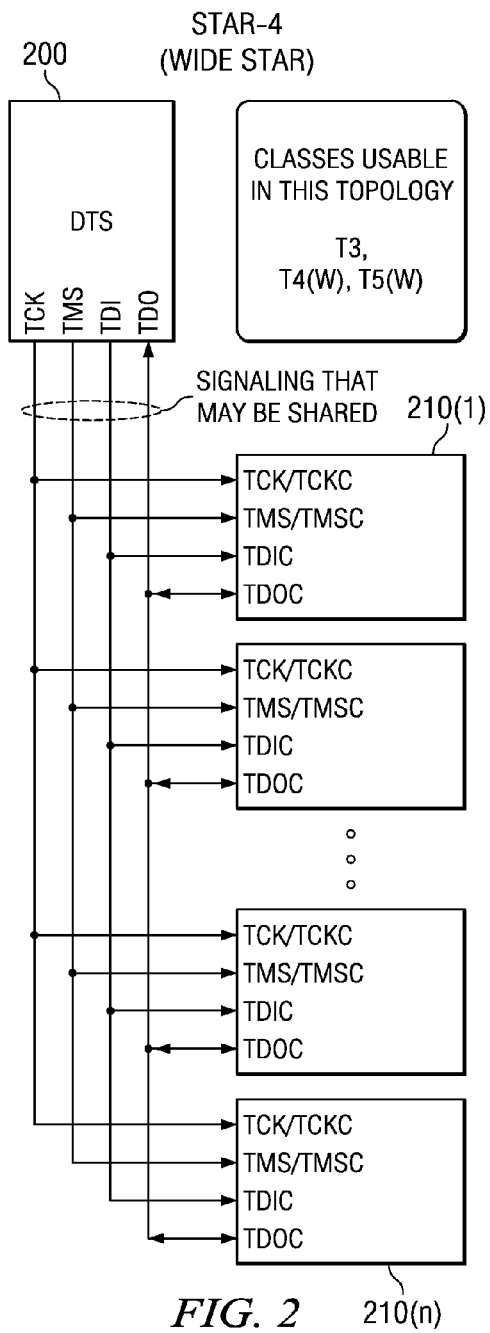
FIG. 2 is a block diagram illustrating a target system with four-wire star scan topology.

Class T3 provides for boundary scan testing using a four signal star topology (Star-4), with TAP selection built into the TAP.7 controller, unlike the use of a Star-4 Scan Topology described by the IEEE 1149.1 Standard. A T3 TAP may be deployed in either a series or star scan topology. A star topology is preferable for testing stacked die configurations. Whereas FIG. 1 shows the series scan topology, FIG. 2 illustrates the Star-4 or Wide Star configuration. In this case, modules 210(1)-210(n) are connected in a parallel manner using four wires and may be connected to DTS 200 that is configured to provide control over a star connected system, as will be described in more detail below. Direct addressability is included with T3 and above TAP.7 controllers.

Class T4 provides a reduction of number of test and debug pins in SoC devices. It supports scan transactions with two pins instead of four, resulting in fewer total pins required on chip packages. This also helps with stacked die configurations because it is highly desirable to have debug pins connected in parallel when dies are stacked. Two-pin operation is provided by eliminating the original data lines and sending bidirectional serialized data over the Test Mode Select (TMS) line, which is renamed TMS Counter (TMSC). To implement this capability, the glueless star configuration from Class T3 is utilized, this time without Test Data In (TDI) and Test Data Out (TDO). This is the Star-2 configuration shown in FIG. 3 in which an illustrative SoC 300 includes several die 302(1)-302(n) connected in a Star-2 arrangement using only two wires in a parallel manner. Of course, other embodiments may have fewer or more die and still use the two pin interconnection. Other embodiments may use the two pin interconnect for interconnection of packaged chips as well as bare or stacked die.

To address the rising number of pins in SoC devices, Class T4 adds scan formats to support transactions with two pins instead of four, resulting in fewer total pins required on chip packages. This also helps with stacked die configurations because it is highly desirable to have the fewest number of connectors possible when die are stacked. The key to two-pin operation is eliminating the original data lines and sending bidirectional serialized data over the Test Mode Select (TMS) line, which is renamed TMS Counter (TMSC). To implement this capability, the glueless star configuration from Class T3 is utilized, this time without Test Data In (TDI) and Test Data Out (TDO). This is the Star-2 configuration shown in FIG. 3 in which an illustrative SoC 300 includes several die 302(1)-302(n) connected in a Star-2 arrangement using only two wires in a parallel manner. Of course, other embodiments may have fewer or more die and still use the two pin interconnection. Other embodiments may use the two pin interconnect for interconnection of packaged chips as well as bare or stacked die.

Besides reducing pin count, Class T4 defines optimized download-specific scan modes in which only useful information is downloaded. To improve pin operation performance, the clock rate also can be doubled. These features combined with the optimized transactions do not cause performance loss, instead improving performance in some cases.

Class T5 functionality is beneficial primarily to software designers utilizing a Test Access Port for debugging. This class gives the test port the ability to perform debug and instrumentation operations concurrently (data is transferred during idle time), which reduces the number of pins dedicated to instrumentation, and enables custom protocols to use the pins, a feature many vendors offer in nonstandard ways. Class T5 standardizes the process used to access the pins and provides both scan and data transport transactions using the two wire interface.

Figure 3:
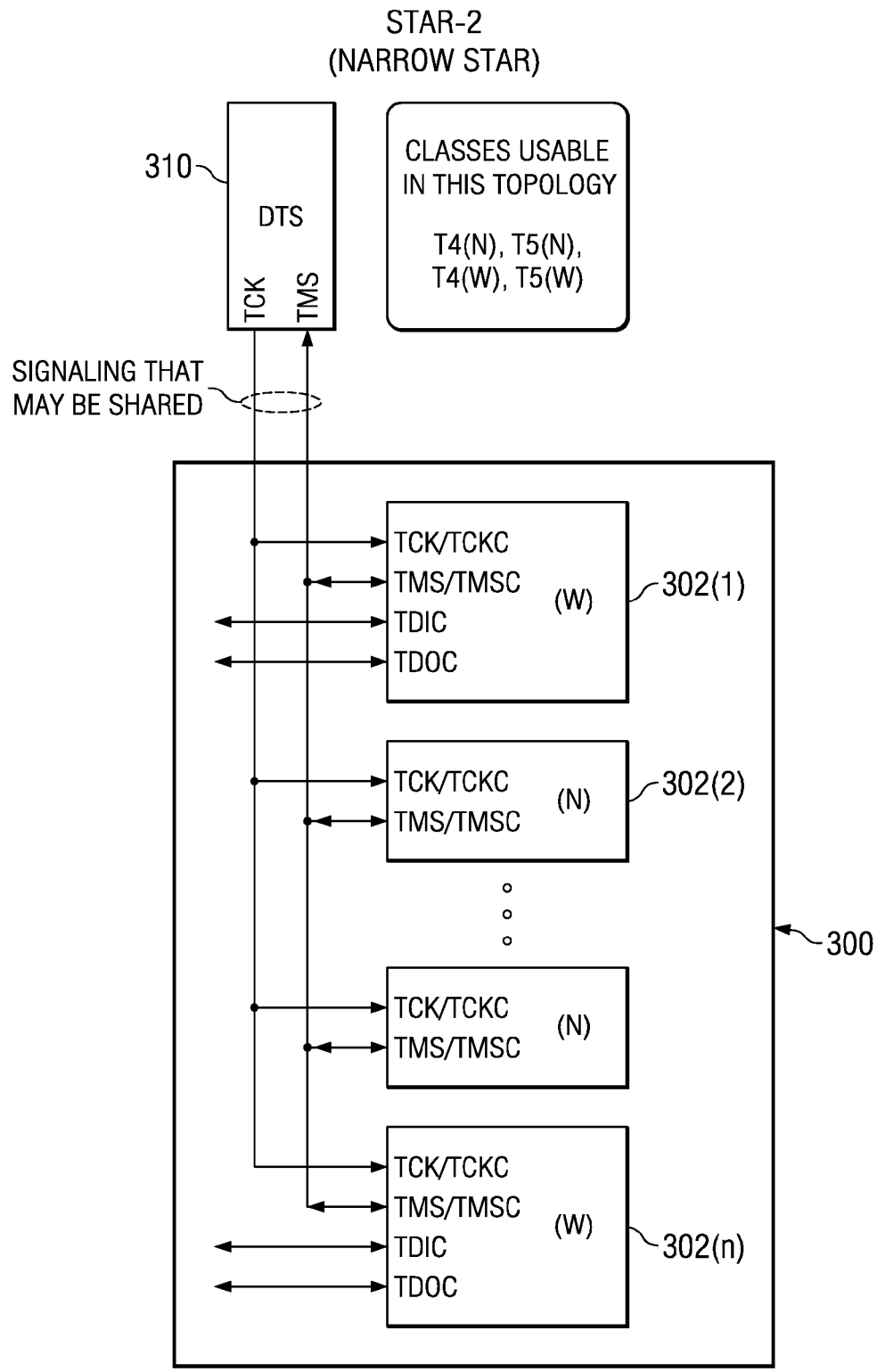
FIG. 3 is a block diagram illustrating a target system with two-wire star scan topology.

FIG. 3 also illustrates a debug test system (DTS) 310 coupled to SoC 300. DTS 310 is generally a computer based system that provides control and a user interface for testing an integrated chip, printed circuit board or SoC using IEEE 1147.1 that has been enhanced to support the IEEE 1147 protocols and two-wire interface, as will be described in more detail below. DTS 310 may be an XDS emulator from Texas Instruments, for example.

T0-T3, and T4/T5 four pin TAP.7s may be deployed in a Series Scan topology. T3 and T4/T5 four pin TAP.7s may be deployed in a Star-4 Scan topology. T4-T5 TAP.7s may be deployed in a Star-2 Scan Topology. When deployed in these scan topologies, all classes can traverse the state diagram using a common protocol (Standard-the legacy IEEE 1149.1 protocol). In the Series Scan Topologies data transfers to conventional 1149.1 instruction and data registers are performed with the Standard Protocol. In the Star-4 scan topology data transfers are performed with the Standard Protocol modified to prevent drive conflicts, with the ability to select the scan paths of only one TAP.7 controller in the topology at a time. This provides for sequential access to the paths of each TAP.7 controller in the branch. In the Star-2 scan topology, data transfers are performed only with the Advanced Protocol. The selection mechanisms for scan paths and TAPCs available with Star-4 operation are also available with Star-2 operation. Classes T0-T2 allow the use only the Standard Protocol, Class T3 allows the use of the Standard Protocol to traverse the TAPC state diagram and a modified Standard Protocol to either traverse the state diagram or perform data transfers in the Shift-IR and Shift-DR states. Classes T4 and T5 allow the use of the Standard Protocol to traverse the TAPC state diagram, a modified Standard Protocol to either traverse the state diagram or perform data transfers in the Shift-IR and Shift-DR states, when operated in a Star-4 Scan Topology, and Advanced Protocols to either traverse the state diagram or perform data transfers in the Shift-IR and Shift-DR states when operated in a Star-2 Scan Topology. It is important to note that with deployment in Star-4 and Star-2 topologies, TAP 0.7 controllers perform data transfers in these scan topologies using protocols unique to the topology in which they are deployed.

With Series Equivalent Scans, the selection of a single branch initiates the use of the protocol required to transfer data, while the selection of all branches initiates the use of the Standard Protocol since only traversing the state diagram is needed.

The operation of each of these Scan Topology Branches supports the selection of individual TAPCs and the scan paths associated with them during their independent operation. This is covered in the 1149.7 standard and not in this description.

TAP.7 architecture provides for the operation of Series, Star-4, and Star-2, Scan Topologies and other technologies sharing the TCK(C), TMS(C), TDI(C), and TDO(C) connections to a Debug Test System directing scan activity. These Scan Topologies are called branches of the system scan topology. With this architecture, an Adapter Test Access Port Controller (ADTAPC) is the gateway to scan facilities of a chip implementing an 1149.7 Test Access Port. The ADTAPC controls access to a Chip-Level Test Access Port Controller (CLTAPC) that provides access to chip-level scan paths Since a typical boundary scan operation requires scanning the instruction registers and boundary scan cells of one or more devices between the Select-xR and Update-xR states, a method is needed to duplicate the scan transaction available with a Series Scan topology when more than one scan topology is involved. With this description, states such as the Capture-xR and Update-xR TAP are to be interpreted as follows: the "x" refers to either "D" for data or "I" for instruction. Embodiments of the invention provide this equivalent function, a series equivalent scan.

Series equivalent scans of a complex scan topology, i.e., a scan topology with two or more branches in which at least two of the branches are of differing technologies (see Table 1), sharing the same control and data signaling create the equivalent of an 1149.1 series scan that begins with the Select-xR state and ends with the Update-xR state. With a series Scan Topology, all scan paths of interest are scanned at the same time between these states. With a complex scan topology, this is not possible as methods used to transfer data to and from scan paths presented by Series, Star-2, and Star-4 Scan Topologies and other technologies is different.

With series equivalent scans, a scan is broken into sections consisting of one or more scan sections. With an 1149.7 Test Access Port, the scan section is one or more sequences of the Exit2-xR, one or more Shift-xR states, Exit1-xR, and one or more Pause-xR states. With another technology, scan data would be delivered as defined by the technology. These scan sections are sandwiched between a preamble (Select-xR, Capture-xR, Exit1-xR, and one or more Pause-DR states) and a postamble (Exit2-xR and Update-DR states). A single branch is selected between the preamble and the first scan section and between scan sections. All branches are selected between the last scan section and the postamble. With the sequence described above, all or some CLTAPCs in all branches progress from either the Test-Logic-Reset or Pause-xR state to the Pause-xR state without encountering an Shift-xR state. The TAPCs of all branches of interest operate in lockstep during the preamble and postamble state sequences, with only the TAPCs within branches that are selected during scan sections.

TABLE 1

Protocol usage by Technology

| TAPC State | Protocol | Topology Selected | Operation of Branches | | | |
|---|---|---|---|---|---|---|
| | | | Series | Star-4 | Star-2 | Other |
| Select-xR | Standard | All | Active | Active | Active | Active |
| Capture-xR | Standard | All | Active | Active | Active | Active |
| Exit1-xR | Standard | All | Active | Active | Active | Active |
| Pause-xR | Standard | All | Active | Active | Active | Active |
| — | — | — | Select-Series. | | | |
| Pause-xR | Standard | Series | Active | Dormant | Dormant | Dormant |
| Exit2-xR | Standard | Series | Active | Dormant | Dormant | Dormant |
| Shift-xR | Standard | Series | Active | Dormant | Dormant | Dormant |
| Shift-xR | Standard | Series | Active | Dormant | Dormant | Dormant |
| Exit1-xR | Standard | Series | Active | Dormant | Dormant | Dormant |
| Pause-xR | Standard | Series | Active | Dormant | Dormant | Dormant |
| — | — | — | Select-Star-2 | | | |
| Pause-xR | Advanced | Star-2 | Dormant | Dormant | Active | Dormant |
| Exit2-xR | Advanced | Star-2 | Dormant | Dormant | Active | Dormant |
| Shift-xR | Advanced | Star-2 | Dormant | Dormant | Active | Dormant |
| Shift-xR | Advanced | Star-2 | Dormant | Dormant | Active | Dormant |
| Exit1-xR | Advanced | Star-2 | Dormant | Dormant | Active | Dormant |
| Pause-xR | Advanced | Star-2 | Dormant | Dormant | Active | Dormant |

TABLE 1-continued

Protocol usage by Technology

| TAPC State | Protocol | Topology Selected | Operation of Branches | | | |
|---|---|---|---|---|---|---|
| | | | Series | Star-4 | Star-2 | Other |
| — | — | — | Select-Star-4 | | | |
| Pause-xR | Modified Std | Star-4 | Dormant | Active | Dormant | Dormant |
| Exit2-xR | Modified Std | Star-4 | Dormant | Active | Dormant | Dormant |
| Shift-xR | Modified Std | Star-4 | Dormant | Active | Dormant | Dormant |
| Shift-xR | Modified Std | Star-4 | Dormant | Active | Dormant | Dormant |
| Exit1-xR | Modified Std | Star-4 | Dormant | Active | Dormant | Dormant |
| Pause-xR | Modified Std | Star-4 | Dormant | Active | Dormant | Dormant |
| — | — | — | Select-Other | | | |
| Pause-xR | Tech. Defined | Other | Dormant | Dormant | Dormant | Active |
| Exit2-xR | Tech. Defined | Other | Dormant | Dormant | Dormant | Active |
| Shift-xR | Tech. Defined | Other | Dormant | Dormant | Dormant | Active |
| Shift-xR | Tech. Defined | Other | Dormant | Dormant | Dormant | Active |
| Exit1-xR | Tech. Defined | Other | Dormant | Dormant | Dormant | Active |
| Pause-xR | Tech. Defined | Other | Dormant | Dormant | Dormant | Active |
| — | — | — | Select-All | | | |
| Pause-xR | Standard | All | Active | Active | Active | Active |
| Exit2-xR | Standard | All | Active | Active | Active | Active |
| Update-xR | Standard | All | Active | Active | Active | Active |

Table 1 lists various protocols that may be used with a Series Equivalent Scan. A protocol understood by the TAPCs of a selected branch is used to drive the state progression of a scan section. It is not necessary that the TAPCs forming a deselected branch understand the protocol used during this state progression. Scan operations are performed on the selected branch while the other branches remain dormant. Branches that are not selected remain dormant and ignore the protocol being used until they are selected. Once all branches are selected following the last scan section, the TAP controllers forming all branches move through the Update-xR and Capture-xR states in lock step. This provides the function of a series scan.

In summary, a scan of the paths with a branch move the state of the TAPCs forming the branch to Pause-xR, sequentially selecting and scanning the scan paths of interest within each branch beginning and ending the scans in the Pause-xR state. Once these scans are complete, the update/capture operation is performed simultaneously in all TAPCs of all branches of interest The TAPC state may be moved from the Update-xR state to either the Run-Test/Idle state or Select-DR state on to the Pause-xR state where the sequential scans can again be performed. This process preserves the timing between the Update-xR and Capture-DR states when portion of the operation that does not include the Shift-xR state is performed using the Standard Protocol.

The Run-Test-Idle state may also be used to select branches. This capability can be used to select a branch and park the state of one or more of the TAPCs forming the branch. This may be sequentially done for all branches. Only those TAPCs within a branch that are not parked may leave the Run-Test-Idle state. When all branches are selected and the TAPC state moved to the Pause-DR state via the Select-DR state. The TAPCs whose state is parked in Run-Test-Idle state do not participate in the scans.

A Selection Escape Sequence is used to initiate a selection sequence. This sequence can select all ADTAPCs within a branch while deselection all ADTAPCs within other branches or select all ADTAPCs within all branches. A deselection escape sequence deselects all ADTAPCs of all branches. Although selection and deselection escapes can be associated with any ADTAPC state, they are expected to be used while in the Pause-xR and Run-Test-Idle states. This process will be described in more detail below.

DTS/TS Connectivity

The TAP.7 architecture supports both simple and complex system connectivity with a graduated set of capability. A system may deploy any mix of TAP.1s, TAP.7s, and potentially other legacy technologies as shown in FIG. 4, which is a block diagram of a target system with mixed use of technologies and scan topologies.

Most systems will implement only one branch of the connectivity shown in this figure. In most cases, the target system (TS) will only have a limited number of TAPs. Other architectures, represented by branches 406, 407, can also be included as additional branches that are separate from those shown in FIG. 4 in a custom scan topology. These branches are controlled in manner similar to TAP.7 branches.

Technology Branches

Figure 4:
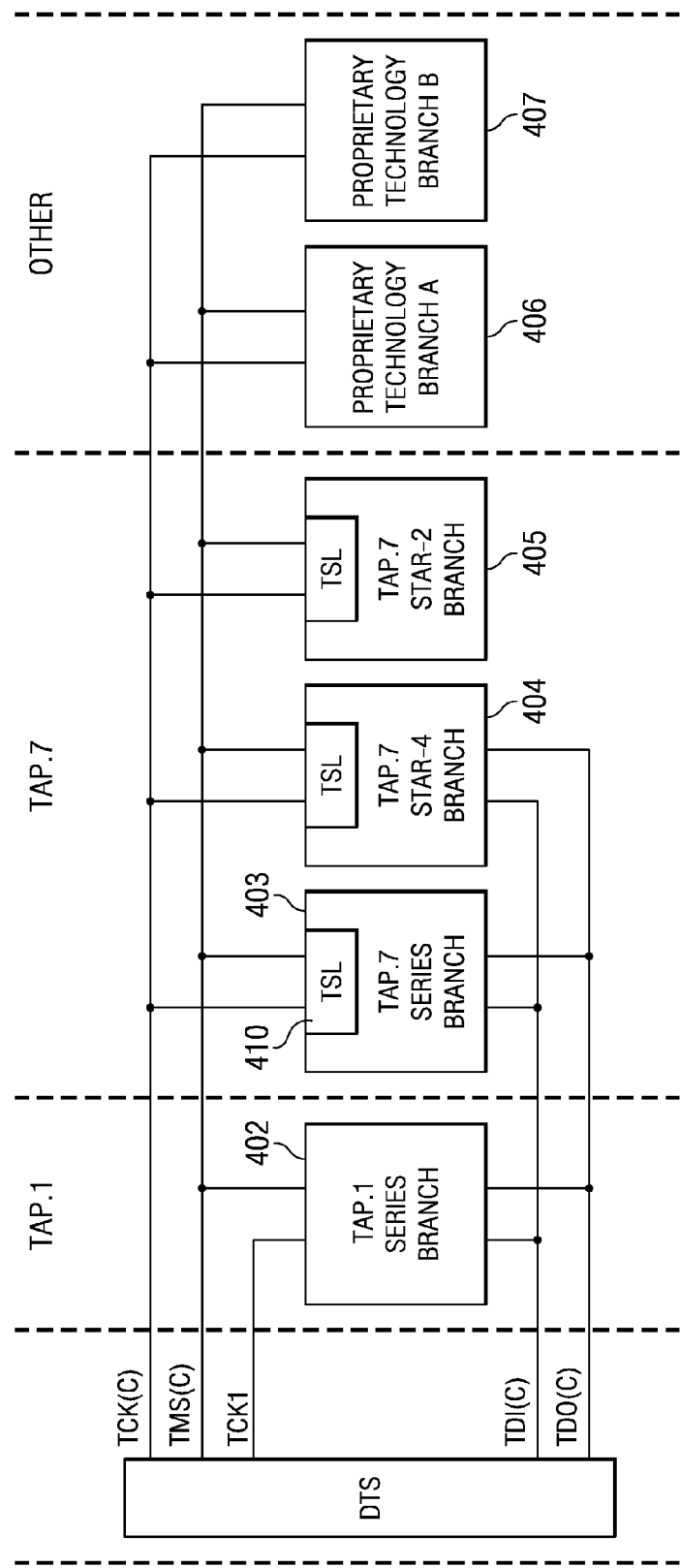
FIG. 4 is a block diagram of a target system with mixed use of technologies and scan topologies.

FIG. 4 is the union of simpler types of connectivity called technology branches. Each of the branches 402-407 shown in this figure may be operated separately for debug purposes. They may also be operated in a manner that provides Series Scan Equivalency across the branches controlled with the TCK1 and TCK(C) signals. Proprietary technologies are generally operated separately but may be operated with TAP.7 controllers in as shown in Table 1. Other embodiments may have various combinations of branch operation.

Other embodiments may have various combinations of branch operation. Other embodiments may use different sets of commands, protocols, events, etc. The list of protocols in Table 1 is not intended to be limiting to embodiments of the invention in any manner.

The TAP.7 branches 403-405 have one or more TAP.7s connected in Series, Star-4, and Star-2 Scan Topologies. These branches contain logic to select or deselect an ADTAPC, indicated generally at 410. This logic provides for the selection and deselection of these branches with Selection and Deselection Escape Sequences. ADTAPC selection logic is optional for T0-T2 TAP.7s and mandatory for T3 and above TAP.7s. Including this logic in T0-T2 TAP.7s supports their deployment in systems where T4(N) and T5(N) TAP.7s may be deployed.

The TAP.1 branch 402 includes a TAP.1 or a T0-T2 TAP.7 without technology selection logic connected in series with other TAP.1s or TAP.7s. It operates with the standard protocol and TAPs with the four 1149.1 signals. This branch is selected using the TCK1 signal shown in this figure as it has no built-in selection mechanism. T0-T2 TAP.7s without selection must be included in a branch that is this type. The ADTAPC selection logic may be added to the current 1149.1 technology to make it selectable using common connectivity.

Proprietary technologies 406, 407 may be connected in parallel with the TAP.7 branches provided: the technology has a dedicated clock and at least one control/data input; the technology implements the technology selection mechanisms and protocols defined by the 1149.7 standard; and the clock pin of the technology is connected to the TCK(C) signal and the control/data pin is connected to the TMS(C) signal.

As noted previously, a TAP.1 branch is selected by keeping its TCK or TMS signal separated from the signal of like name of branches and gating one of the separate signals to deselect the branch. The gating of the TCK signal of this type of branch is used to select these types of branches. TAP.1s and T0-T2 TAP.7s without the Technology Selection Logic (TSL) are selected using this method. Any branch may be selected using this method if desired.

TAP.1s and TAP.7s can be deployed in topology branches as shown in Table 2. Each of these topologies is considered a technology within this document.

TAP.7 Deployment Scenarios

Figure 6:
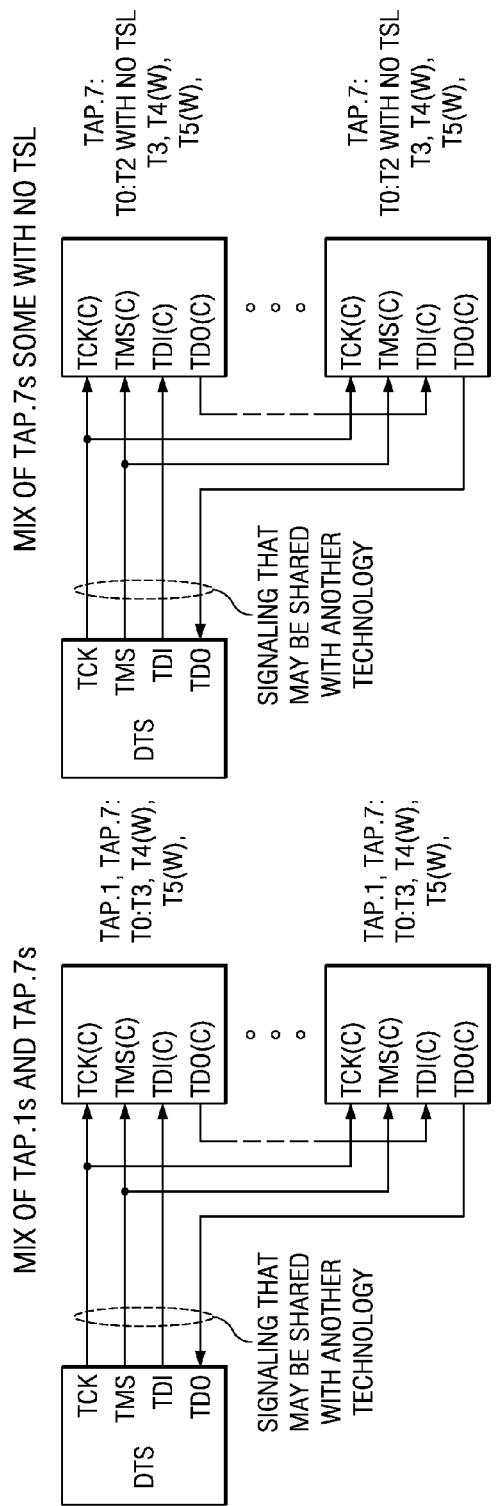
FIG. 6 is a series topology with mix of TAP.7s plus TAP.1s or TAP.7s with no TSL.

Series branches may be constructed from TAP.1s and four pin TAP.7s as shown in FIG. 6. This scan topology may share the TMS, TDI, and TDO connectivity with another topology provided TCK(C) or TMS(C) signal is used to select/deselect this topology.

50B In most cases, one or more TAP.7s is connected in one of the Scan Topologies shown in FIGS. 1-3. Note that the convention for naming DTS TDI/TDIC and DTS TDO/TDO signals in FIGS. 1-3X is: 1) The DTS TDI/TDIC signal sources chip TDI information; 2) The DTS TDO/TDOC signal is the destination for chip TDO information.

The Star-2 Scan Topology illustrated in FIG. 3 is a subset of both the Series and Star-4 Scan Topologies. This means that the Series and Wide Star Scan Topologies may be operated as a Star-2 Scan Topology when every test access port sharing the connection is a T4 and above TAP.7.

Chip TAPC Hierarchy

A hierarchical view of TAPCs within a chip is needed to maintain IEEE 1149.1 compliance and provide solutions to the compatibility requirements identified earlier. For a given chip, three or more levels of TAPC hierarchy are accommodated as follows:

$1^{st}$ level—a TAPC within the TAP.7 controller—the primary interface to the DTS.

$2^{nd}$ level—a TAPC at the chip-level (CLTAPC).

$3^{rd}$ level—embedded TAPCs connected to the chip-level TAPC.

Other levels, if needed.

FIG. 10 is a block diagram illustrating bypass bits that are provided to bypass the scan paths managed by the CLTAPC when it is deselected. With a Series Scan Topology, the bypass

TABLE 2

Branch/technology deployment permissibility

| Branch | Proprietary | TAP.1 | T0-T2 w/o TSL | T0-T2 w/TSL | T3 | T4(W) | T5(W) | T4(N) | T5(N) |
|---|---|---|---|---|---|---|---|---|---|
| TAP.1 Series | No | Yes | Yes | Yes | Yes | Yes | Yes | No | No |
| TAP.7 Series | No | No | No | Yes | Yes | Yes | Yes | No | No |
| TAP.7 Star-4 | No | No | No | No | Yes | Yes | Yes | No | No |
| TAP.7 Star-2 | No | No | No | No | No | Yes | Yes | Yes | Yes |
| Proprietary | Yes | No | No | No | No | No | No | No | No |

Chips, Components, and Boards

With the TAP.7 architecture, any part of the connectivity shown in FIG. 4 may be deployed on a board, within a package, or within a chip. This comprehends the packaging and integration trends since the inception of the 1149.1 Standard.

The IEEE 1149.1 test view allows only one TAPC per component. The 1149.7 test view is a superset that allows multiple TAPCs per component. With the 1149.7 test view a component: is either a package containing one or more chips, or a direct mount chip; provides access to one or more TAP.1 or TAP.7 controllers through the same or separate pins; and provides access to proprietary TAPCs or other technologies through the same or separate pins.

Figure 5:
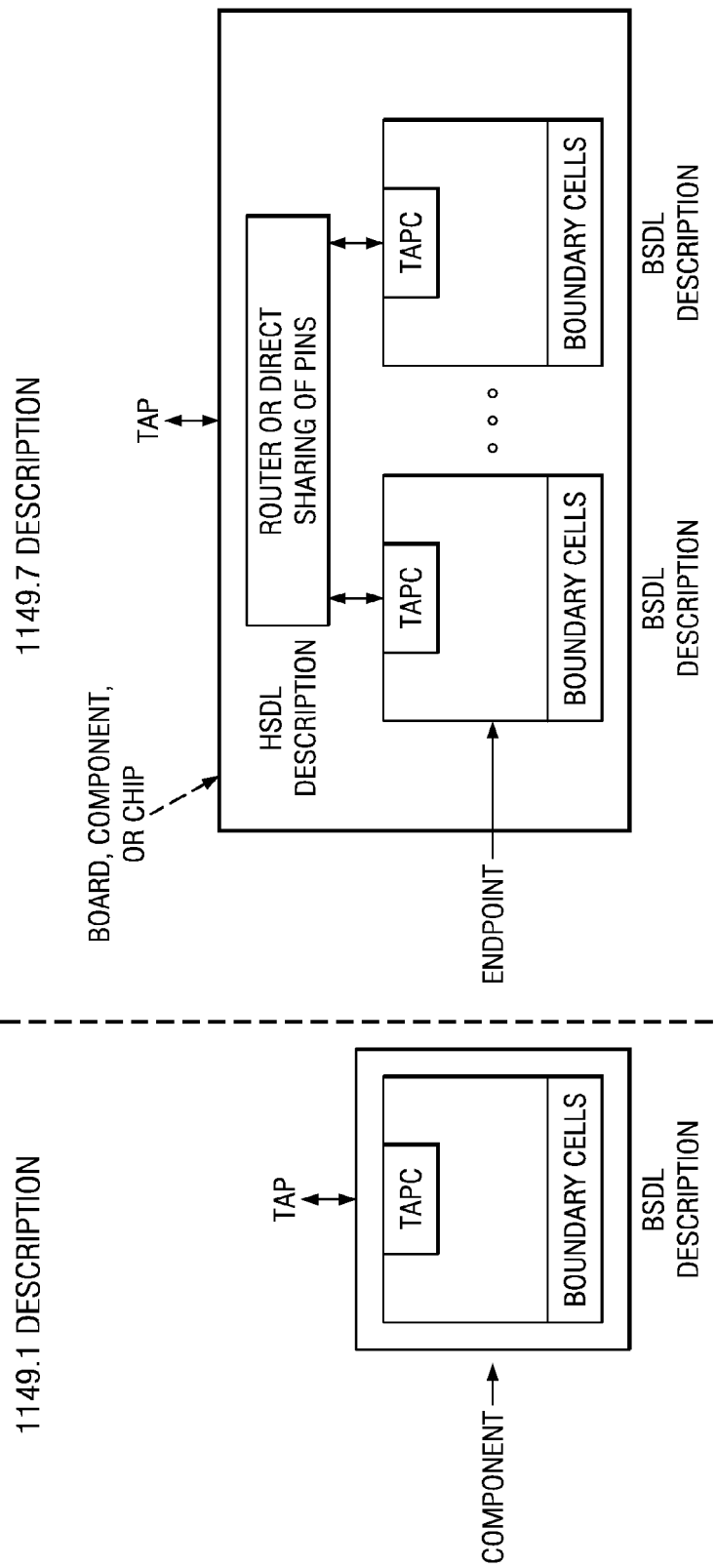
FIG. 5 is an illustration contrasting 1149.1 and 1149.7 test views.

This superset blurs the boundary between board, component, and chip. This blurring allows operation across those boundaries as shown in FIG. 5. When there is only one TAPC per component, the 1149.1 and 1149.7 test views are described by boundary scan description language (BSDL). When there is more than one TAPC per component the 1149.7 test view requires hierarchical scan description language (HSDL), plus BSDL for each endpoint.

bits allow faster propagation of a scan data between the DTS's TDI(C) and TDO(C) signals when the contents of the bypassed component is not of interest.

Figure 7:
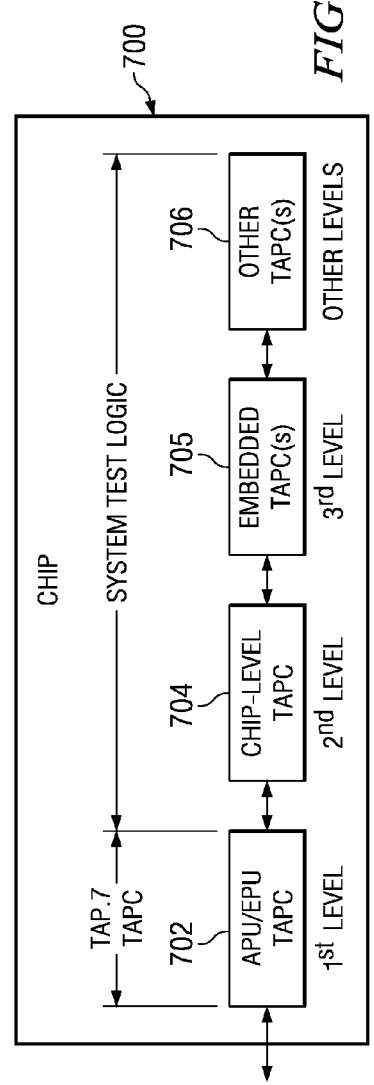
FIG. 7 is a block diagram illustrating TAP.7 TAPC hierarchy.

While all levels of the TAPC hierarchy need not be present in all chips, the TAP.7 architecture accommodates them when they occur. The TAPC hierarchy is shown in FIG. 7. Exemplary chip 700 includes TAPC 702 that is implemented as a T0 with control events or a TSL for T1 and above. Chip level TAPC (CLTAPC) 704 operates under Adapter TAPC (ADTAPC) 700. Embedded TAPC(s) (EMTAPCs) 705 operate under CLTAPC 704. Additional levels of EMTAPCs 706 may be embodied as needed. The EMTAPC(s) 705 and EMTAPC(s) 706 are hidden following a test reset.

A chip with IEEE 1149.7-compliant behavior always has a Chip-Level TAPC 702. It may also include one or more Embedded TAPCs 704, all of which are considered subordinate to the chip-level TAPC (CLTAPC). The CLTAPC is considered the parent of the Embedded TAPC(s). The addition of the Enhanced Protocol Unit (EPU) to a T1 or above TAP.7 controller adds the ADTAPC but does not add an instruction or data registers in series or parallel with those associated with the CLTAPC and the EMTAPCs. The ADTAPC is considered the parent of the CLTAPC. The addition of the Advanced Protocol Unit (APU) in a T4 or T5 TAP.7 does not add an additional TAPC or level of TAP.7 TAPC hierarchy.

The ADTAPC 702 is connected to the CLTAPC 704. The CLTAPC may provide access to EMTAPCs. The EMTAPCs are hidden following a Test Reset to present the test view of a component specified by the 1149.1 Standard. The "other TAPCs" portion of the hierarchy can have additional levels of hierarchy. The TAPC hierarchy may vary dramatically by chip, with the TAPs accessed varying by application. In one or more embodiments of the invention, the DTS dynamically manages the TAPC hierarchy to: accommodate a Star Scan Topology, minimize the length of the scan path, and avoid non-functional parts of the hierarchy.

Combined View of TAP Connectivity and TAPC Hierarchy

Figure 8:
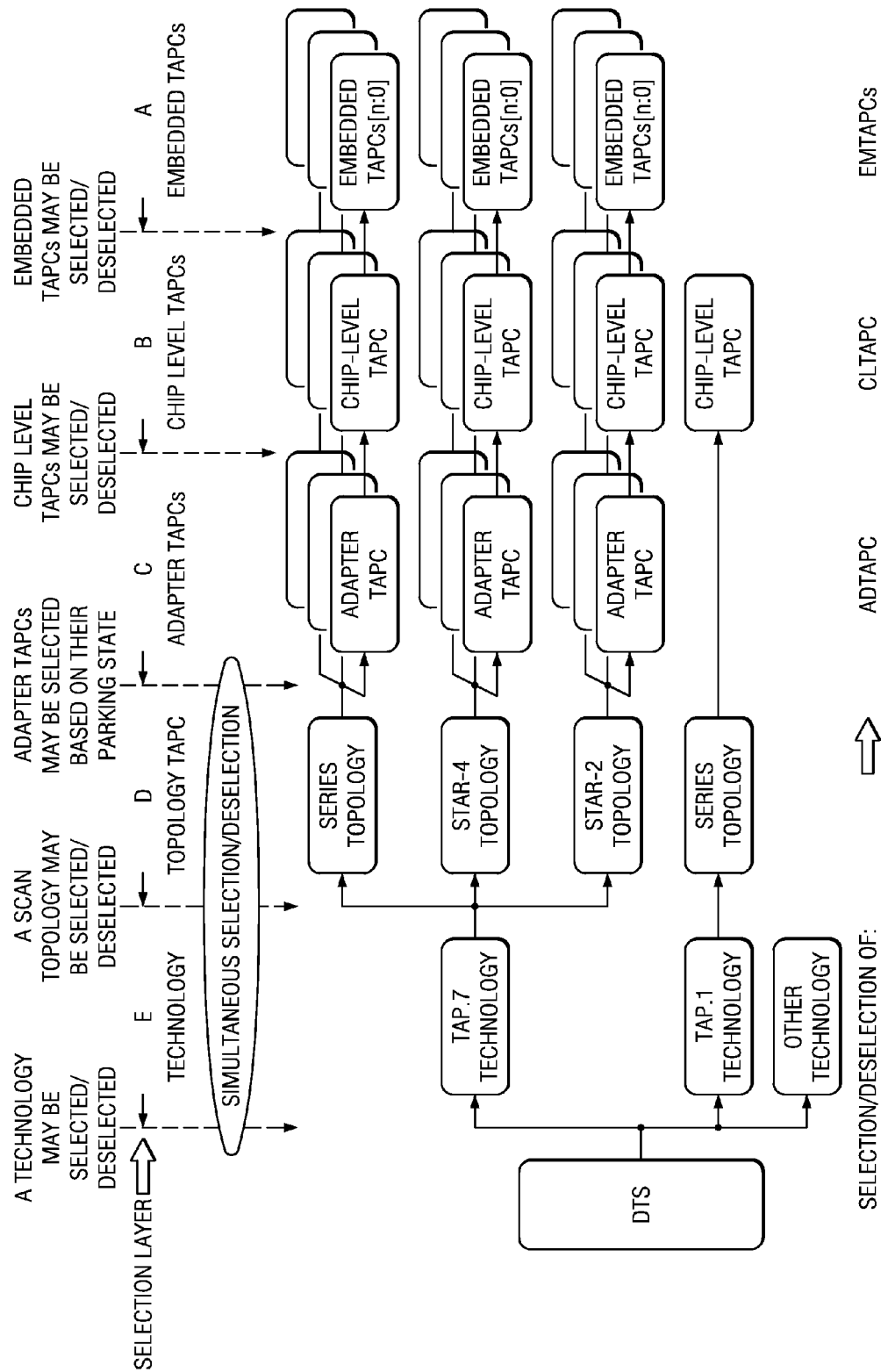
FIG. 8 is an illustrative block diagram of system connectivity supported by TAP.7 architecture.

The combination of the system shown in FIG. 4 and the TAP.7 TAP hierarchy shown in FIG. 7 creates the system connectivity and TAPC hierarchy shown in FIG. 8. The selection layers (labeled A-E) are shown this figure. The entities actually selected and deselected are shown at the bottom of this figure.

Selection Concepts

Additional selection concepts beyond those supported by the IEEE 1149.1 standard are provided to access to the CLTAPCs and EMTAPCs shown in FIG. 8. These concepts support: the use of the selection hierarchy, the parking of CLTAPC and EMTAPC states and resynchronization of the CLTAPC and EMTAPC to the state of their parent, and common signaling across technologies.

Hierarchical Selection and Deselection TAPCs

These concepts provide the DTS the means to interact with all or a subset of the technology connected to it. They provide a means to select the various levels of the hierarchy shown in FIG. 8. Lower levels of the hierarchy become usable when all nodes above it are selected and become unusable when any node above it is deselected. Selection and deselection is provided at the following nodes in the hierarchy: specific technology, Series, Star-4, Star-2, or all TAP.7 Scan Topologies, an ADTAPC within a TAP.7 Scan Topology (depending on the ADTAPC state), a CLTAPC connected to an ADTAPC, and EMTAPCs connected to a CLTAPC.

Determining the Scan Topology

In order for the Debug and Test System to select a particular scan topology, the TAP.7 controller's associated with a scan topology must be able to determine this association. The Debug and Test System can inform a TAP.7 controller as to the scan topology in which it resides in simple Scan Topologies. This is not the case with complex scan topologies.

Since T0-T2 TAP.7s can only be used with a Series Scan Topology, these TAP.7 controllers are presumed to be always operating in a Series Scan Topology. Since a T3 and above TAP.7 controller can be operated in either a Series or a Star-4 Scan Topology, T4(W) and T5(W) TAP.7s can be operated in Series, Star-4, and Star-2 Scan Topologies, and T4(N) and T5(N) TAP.7s can be operated in Star-2 Scan Topologies, a TAP.7 controller's association one of these scan topologies must be determined at run-time. This is accomplished using a process called Scan Topology Training With T3 and above TAP.7s, a TAP.7 controller determines the scan topology in which it resides with Scan Topology Training as follows. The Debug and Test System informs the TAP.7 controllers that Scan Topology Training is underway. It then stimulates the Scan Topology connected to it with TDI (C) and TDO(C) signal values and DR-Scans in a manner that produce differences in the TDI(C) and TDO(C) signal values and scan data observed by TAP.7 controllers in Series, Star-4, and Star-2 Scan Topologies. The TAP.7 controller records the TDI(C) and TDO(C) signal values along with scan data during Scan Topology Training in the Topology (TOPOL) Register. At the conclusion of the training, the TOPOL Register value identifies the scan topology in which the TAP.7 controller resides as the value of the TOPOL Register is are different for TAP.7 controllers deployed in Series, Star-4, and Star-2 Scan Topologies. Each T3 and above TAP.7 includes a TOPOL register, as indicated generally at 920 in FIG. 9.

Topology Register Function

The Topology Register values specify the topology as listed in Table 3.

TABLE 3

| Topology Register Values | | |
|---|---|---|
| TOPOL value | Topology | TDOC behavior |
| 00 | Star-4 | TDOC remains HI-Z |
| 01 | Series | TDOC may be driven |
| 10 | Star-4 with TDO drive allowed | TDOC may be driven |
| 11 | Star-2 | TDOC may be driven |

As shown in Table 3, the Topology (TOPOL) Register value affects two operating characteristics: it defines the TAP.7 topology that must be specified during selection sequences for the TAP.7 to be placed Online; and it provides a means to HI-Z the TDO signal to prevent drive conflicts that could occur when the scan topology involves both Series and Star-4 Scan technology branches in certain cases (not described herein).

Scan-Path Characteristics Used to Determine the Scan Topology

FIG. 9 is a block diagram illustrating system connectivity supported by the TAP.7 architecture. Exemplary components indicated generally at 902 represent the various components in the target system. Each component includes a scan path that is one or more bits in length. Pins have pull-ups to establish logic value when they not driven. The device 910 does not have TDI(C) and TDO(C) pins. The internal inputs therefore are a logic 1 for these pins. A debug and test system is connected to the TCK(C), TMS(C), TDI(C), and TDO(C) pins. It is capable of driving both the TDI(C) and TDO(C) pins.

Referring again to FIG. 9, the following attributes of Series, Star-4, and Star-2 Scan Paths are used to determine the scan topology in which a TAP.7 controller is deployed. A Series Scan Topology provides scan-path continuity via TDI (C) and TDO(C). Only one of the TDI(C) and TDO(C) signals may be connected to the DTS unless there is only one TAP connected to the DTS. A Star-4 Scan Topology provides scan-path continuity via TDI(C) and TDO(C). Both the TDI (C) and TDO(C) signals are connected to the DTS. In a Star-2 Scan Topology the EPU's TDI signal and TDO inputs are fixed at a logic 1 value when these pins are either not implemented or the TDI(C) and TDO(C) pins are used for alternate functions.

A two step process, scan connectivity and scan continuity testing, that is orchestrated by the DTS exposes characteristics of a TAP.7 controller's connectivity used to determine the Scan Topology.

The scan connectivity test records the TDIC and TDOC signal values when both of these signals are driven by the DTS. This test determines whether a TAP.7 controller is deployed in a Star-4 Scan Topology. A logic 0 created by the DTS at the TDIC and TDOC signals can only be observed as such by TAP.7 controllers deployed in a Star-4 Scan Topology. TAP.7 controllers that are deployed in a Series or Star-2 Scan Topology observe either one or both of these signals as a logic 1. When the connectivity test determines the TAP.7 controller is deployed in a Star-4 Scan Topology, this determination survives the connectivity test that follows.

The connectivity test determines whether TAP.7 controllers that are not determined to be deployed in a Star-4 Scan Topology are deployed in a Series or Star-2 Scan Topology. This determination is made based on the scan data values observed during an all zeroes DR-Scan whose length is greater than the longest series scan path. A TAP.7 controller that observes logic 0 scan data is determined to be deployed in a Series Scan Topology while a TAP.7 controller that observes logic 1 scan data is determined to be deployed in a Star-2 Scan Topology. The connectivity and continuity tests are sufficient to determine the scan topology as shown in Table 4.

TABLE 4

Scan topology connectivity and continuity tests results

| TOPOL | Connectivity test TDIC and TDOC signal value observations | | | Continuity test Scan data value observations along with no Star-4 determination | |
|---|---|---|---|---|---|
| | TDIC | TDOC | Scan topology determination | Data observed | Scan topology determination by connectivity test |
| Series | 0b | 1b | No | 0b | Yes |
| Series | 1b | 0b | No | 0b | Yes |
| Series | 1b | 1b | No | 0b | Yes |
| Star-4 | 0b | 0b | Yes | 0b | — |
| Star-2 | 1b | 1b | No | 1b | Yes |

Scan Topology Training Command Sequence

Scan Topology Training utilizes the following sequence of commands to perform the connectivity and continuity tests: 1) CMD (STC2, APFC=Standard function), which configures the TDIC and TDOC pins of T4 and above TAP.7s as the T3 TAP.7 pin functions unless inhibited by the Chip-Level logic; 2) CMD (STC2, TOPOL=Star-4-HI-Z, unconditional), which sets the Topology Register for all T3 and higher TAP.7s to Star-4-HI-Z; 3) CMD (STMC, Test for Star-4 Scan Topology), which tests for a Star-4 Scan Topology while the DTS drives both TDI(C) and TDO(C) to a logic 0 during the Update-DR state of CP2 of the command; and 4) CMD (SCNB, Test for Series Scan Topology), which tests for a Series Scan Topology with a CR Scan of all zeros whose length is longer than the longest possible scan path.

The TOPOL Register records the results of connectivity and continuity tests performed by the STMC and SCNB Commands. The values of this register and their meaning are shown in Table 3. A Type-0-Type-3 Reset initializes this register value to 00b indicating Star-4-HI-Z when the startup option is Offline-at-Start-up-and to 01b indicating Series. Note that the Test-Logic-Reset state (a Type-4 Reset) does not change this register value. Subsequent to this, Scan Topology Training or commands may alter this value.

Connectivity Test

The STMC Command is used to perform the connectivity test. This command determines whether the scan topology is Star-4. The DTS drives the TDI(C) and TDO(C) signal values to a logic 0 value prior to the Update-DR state of Command Part 2 (CP2) of this command. The logic 0 TDI(C) and TDO(C) values can be easily accomplished using the following TAPC state machine state sequence to end CP2 of the STMC Command:

Exit1-DR>Pause-DR (N)>Exit2-DR>Update-DR>Select-DR-Scan>Capture-DR>Exit1-DR>Pause-DR (N)

The DTS may drive both TDI(C) and TDO(C) signals to a logic 0 beginning at a point within the first Pause-DR state and release the drive of the TDO(C) signal (or both signals) at a point within the second Pause-DR state of this series of states. TAP.7 controllers deployed in a Star-4 Scan Topology see both the TDI(C) and TDO(C) signals as a logic 0. TAP.7 controllers that are deployed in either a Star-2 or Series Scan Topology see at least one of these signals as a logic 1. The Update-DR state of this sequence samples the TDI(C) and TDO(C) values and sets the Scan Topology Register to 00b when TDI(C) and TDO(C) values are both a logic 0 and 01b otherwise. A logic 0 value is sufficient to determine that the TAP.7 controller is deployed in a Star-4 Scan Topology.

Continuity Test

When the TOPOL Register value is 00b, the drive of TDO(C) is inhibited. This allows both the use of commands to deselect the CLTAPC when the ADTAPC is placed online following being placed Online following Offline-at-Start-up and the use of an SCNB Command to perform the continuity test without a drive conflict. With this TOPOL Register value, the TDO(C) drive is inhibited until the SCNB part of the test is completed. This prevents TDO(C) drive conflicts that would otherwise be possible during the CR Scan of the SCNB Command. A Series Branch will drive TDO while Star-4 and Star-2 Branches will not. Only one TAP.7 controller may drive the DTS TDO(C) connection.

The SCNB Command determines whether the scan topology is Star-2 or Series with TAP.7 controllers that have not already determined they are deployed in a Star-4 Scan Topology. The CR Scan of this command uses all zeroes data with a length greater than or equal to the series scan-path length of the Series Scan Topology. The EPU Bypass Bit of a TAP.7 controller in a Star-2 Scan Topology is a logic 1 at the end of this CR Scan while the EPU Bypass Bit of a TAP.7 controller in a Series Scan Topology is a logic 0 at the end of this CR Scan. This difference defines the scan topology when the Update-DR state of the CR Scan occurs. The Update-DR state of the SCNB CR Scan also converts the 00b TOPOL Register value to 10b.

TABLE 5

Topology Tests/TOPOL register relationships

| Test | TDIC or TDOC signal observed as a logic 1? | Scan data observed as a == 1? | TOPOL Register | Resulting TOPOL Register value: |
|---|---|---|---|---|
| Connectivity | No | x | x | 00b - Star-4 HI-Z |
| | Yes | x | x | 01b - Series |
| Continuity | x | x | 00b | 10b - Star-4 |
| | x | No | 01b | 01b - Series |
| | x | Yes | 01b | 11b - Star-2 |

TABLE 6

TOPOL register initialization

| Type-0-Type-3 Reset? | Offline-at-Start-up? | Resulting TOPOL value: |
|---|---|---|
| No | x | |
| Yes | Yes | 00b - Star-4 HI-Z |
| Yes | No | 01b - Series |

It should be noted that in the case where there are two scan topologies, the topology may be completely determined by a single test, depending on the two scan topologies involved. Should there be more than the above scan topologies involved, other technologies could also be detected with these tests or by adding additional tests. Topologies could also be made to learn about other Technologies sharing the DTS connection if desired.

FIG. 11 is a flow diagram illustrating topology discovery in a target system having a plurality of components coupled with a scan path. A set of training commands are received 1102 that instruct each component to go into a training session. In this embodiment, the training commands are: 1) CMD (STC2, APFC=Standard function), which configures the TDIC and TDOC pins of T4 and above TAP.7s as the T3 TAP.7 pin functions unless inhibited by the Chip-Level logic; 2) CMD (STC2, TOPOL=Star-4-HI-Z, unconditional), which sets the Topology Register for all T3 and higher TAP.7s to Star-4-HI-Z; 3) CMD (STMC, Test for Star-4 Scan Topology), which tests for a Star-4 Scan Topology while the DTS drives both TDI(C) and TDO(C) to a logic 0 during the Update-DR state of CP2 of the command; and 4) CMD (SCNB, Test for Series Scan Topology), which tests for a Series Scan Topology with a CR Scan of all zeros whose length is longer than the longest possible scan path.

Each component test access port observes 1104 logic levels that appear on the test interface pins, in this case the TDI and TDO pins. The pins are driven by the DTS as described above.

Based on observing the pin behavior, each component test access port determines 1106 the connectivity of the test interface pins, in this case TDI and TDO, and the type of scan topology that surrounds the component, as described in more detail with respect to Table 3.

The TOPOL Register value associates TAP.7 controller with a Scan Topology, and consequently its ADTAPC's selection characteristics. Once the Scan Topology training completes, the ADTAPC may be selected as part of the Scan Topology in which it resides. For example, if it determines it is connected in a series topology, then the ADTAPC may be selected when a Series Topology is selected or any TAP.7 scan topology is selected. If it determines that it is connected in a Star-4 topology, then the ADTAPC may be selected when a Star-4 Topology is selected or any TAP.7 scan topology is selected. If it determines that it is connected in a Star-4 topology, then the ADTAPC may be selected when a Star-2 Topology is selected or any TAP.7 scan topology is selected.

Other Embodiments

While the invention has been described with reference to illustrative embodiments, this description is not intended to be construed in a limiting sense. Various other embodiments of the invention will be apparent to persons skilled in the art upon reference to this description.

Although the embodiments of the invention find particular application to systems using Digital Signal Processors (DSPs), implemented, for example, in an Application Specific Integrated Circuit (ASIC), other embodiment may find application to other types of systems, which may have another type of processors. Another embodiment may also be a system that does not include a processor. An ASIC that embodies the invention may contain one or more megacells which each include custom designed functional circuits combined with pre-designed functional circuits provided by a design library, wherein some or all of the megacells include a test access port.

An embodiment of the invention may be a substrate to which is attached multiple chips that have individual test access ports, commonly referred to multi-chip modules. An embodiment may include stacked die devices that have individual test access ports. Another embodiment may be a substrate, such as a printed circuit board, to which is attached multiple chips that have individual test access ports.

As used herein, the terms "applied," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

It is therefore contemplated that the appended claims will cover any such modifications of the embodiments as fall within the true scope and spirit of the invention.

What is claimed is:

1. An integrated circuit comprising:
   (A) a test clock lead, a test mode select lead, a test data in lead, and a test data out lead;
   (B); a first test access port having a clock input connected to the test clock lead, having a mode input connected to the test mode select lead, having a data input connected to the test data in lead, and a data output connected to the test data out lead, the second test access port including topology selection logic, being coupled in a series branch, and having class T0-T3, T4(W), T5(W) capabilities; and
   (C) a second test access port having a clock input connected to the test clock lead, having a mode input connected to the test mode select lead, having a data input connected to the test data in lead, and a data output connected to the test data out lead, the second test access port including topology selection logic, being coupled in a Star-4 branch, having no class T0-T2 capabilities, and having class T3, T4(W), and T5(W) capabilities.

2. The integrated circuit of claim 1 including an external debug test system coupled to the test clock lead, the test mode select lead, the test data in lead, and the test data out lead.

* * * * *